United States Patent
Ye

(10) Patent No.: US 9,568,654 B1
(45) Date of Patent: Feb. 14, 2017

(54) COLOR FILTER ARRAY SUBSTRATE AND LIQUID CRYSTAL DISPLAY PANEL

(71) Applicant: Shenzhen China Star Optoelectronics Technology Co., Ltd., Shenzhen (CN)

(72) Inventor: Yanxi Ye, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 14/904,952

(22) PCT Filed: Aug. 20, 2015

(86) PCT No.: PCT/CN2015/087619
§ 371 (c)(1),
(2) Date: Jan. 14, 2016

(51) Int. Cl.
*H01L 27/14* (2006.01)
*G02B 5/20* (2006.01)
*G02F 1/1368* (2006.01)
*H01L 27/12* (2006.01)
*G02F 1/1362* (2006.01)

(52) U.S. Cl.
CPC ............ *G02B 5/201* (2013.01); *G02F 1/1368* (2013.01); *H01L 27/1248* (2013.01); *G02F 2001/136222* (2013.01); *G02F 2201/121* (2013.01); *G02F 2201/123* (2013.01)

(58) Field of Classification Search
CPC .................. H01L 27/1214; H01L 27/1248
USPC .............................. 257/59, 72, 258
See application file for complete search history.

(56) References Cited

U.S. PATENT DOCUMENTS

2016/0133173 A1* 5/2016 Tsai .................. G02F 1/13
345/694

* cited by examiner

*Primary Examiner* — Tan N Tran

(57) ABSTRACT

A color filter array substrate is disclosed. The color filter array substrate includes a glass substrate, a first metal layer, an insulating layer, an active layer, an ohmic contact layer, a second metal layer, a first passivation layer, a color filter layer, a second passivation layer, and a pixel electrode layer. In the color filter layer, channels are formed at locations where color resists overlap, a common electrode line is disposed on the first metal layer corresponding to the channels and a metal line is disposed on the second metal layer corresponding to the channels. The present invention can effectively shield light leakage, and can also increase liquidity of the PI and LCD.

11 Claims, 2 Drawing Sheets

COLOR FILTER ARRAY SUBSTRATE AND LIQUID CRYSTAL DISPLAY PANEL

RELATED APPLICATIONS

This application is a National Phase of PCT Patent Application No. PCT/CN2015/087619 having International filing date of Aug. 20, 2015, which claims the benefit of priority of Chinese Patent Application No. 201510504676.9 filed on Aug. 17, 2015. The contents of the above applications are all incorporated by reference as if fully set forth herein in their entirety.

FIELD AND BACKGROUND OF THE INVENTION

The present invention relates to a field of display technology, and more particularly to a color filter array substrate and a liquid crystal display (LCD) panel.

Black column space (BCS) or BM (Black Matrix)-less technology applied to LCD panels can reduce a process using BM, and thus cost can be saved. In the BCS technique, black materials are used in periphery to have an effect of being directly substituted for the BM to function for light shielding. Besides, another effect is to support a thickness of a cell of an LCD panel when the black materials are used in an AA (active area). The light shielding for a scanning line and a data line in the AA relies on mutuality of color resist stacking and metals to carry it out. The stacking of color resists generally employs a red color resist and a blue color resist to be overlapped since the spectrums of these two colors are not overlapped. In this manner, the optical effect would be better.

Current display products applying BCS/BM-less technology on the market use IPS (In-Plane Switching) technology. A layer of planarization layer (PFA) is used in the IPS technology to flatten out a projection generated by overlapping of color resists. However, costs will increase for display products applying BCS/BM-less technology in HVA (high transmittance vertical alignment) mode if the planarization layer is used. Consequently, the planarization layer is not employed in HVA technology. The problem, in which projections around sides are generated due to overlapping of color resists when the HVA-mode display products apply BCS/BM-less technology, is raised, so that a phenomenon is generated about irregular Polyimide (PI) and liquid crystal flow during the processes of PI coating and liquid crystal filling due to the retaining projections around sides and thereby display performance is affected.

Therefore, it is necessary to propose a new technical solution to solve the foregoing technical problems.

SUMMARY OF THE INVENTION

It is an object of the present invention to provide a color filter array substrate and an LCD panel for the purpose of solving a problem existing in the conventional HVA-mode display products applying BCS/BM-less technology, wherein projections around sides are generated due to overlapping of color resists so that a phenomenon of irregular PI and liquid crystal flow is caused during the processes of PI coating and liquid crystal filling and thereby display performance is affected.

To solve the above problems, technical solutions of the present invention are as follows:

According to an embodiment of the present invention, a color filter array substrate comprises a glass substrate; a first metal layer disposed on the glass substrate, the first metal layer comprising a scanning line and a gate of a thin-film field-effect transistor (FET); an insulating layer disposed on the first metal layer; an active layer disposed on the insulating layer; an ohmic contact layer disposed on both ends of the active layer; a second metal layer disposed on the ohmic contact layer, the second metal layer comprising a data line, the source and the drain of the thin-film FET; a first passivation layer disposed on the second metal layer for isolating the second metal layer and a color filter layer; the color filter layer disposed on the first passivation layer, the color filter layer including, sequentially arranged, a first color resist, a second color resist, and a third color resist; a second passivation layer disposed on the color filter layer for isolating the color filter layer and a pixel electrode layer; and a pixel electrode layer disposed on the second passivation layer; wherein channels are formed at locations where color resists overlap in the color filter layer, a common electrode line is disposed on the first metal layer corresponding to the channels in a Y-axis direction, and a metal line is disposed on the second metal layer corresponding to the channels in a X-axis direction.

Preferably, in the above color filter array substrate, the metal line is an extended portion of the drain.

Preferably, in the above color filter array substrate, the channels are respectively formed at the locations where the color resists overlap in the Y-axis direction.

Preferably, in the above color filter array substrate, the channels are respectively formed at the locations where the color resists overlap in the X-axis direction.

According to another embodiment of the present invention, a color filter array substrate comprises a glass substrate; a first metal layer disposed on the glass substrate, the first metal layer comprising a scanning line and a gate of a thin-film FET; an insulating layer disposed on the first metal layer; an active layer disposed on the insulating layer; an ohmic contact layer disposed on both ends of the active layer; a second metal layer disposed on the ohmic contact layer, the second metal layer comprising a data line, the source and the drain of the thin-film FET; a first passivation layer disposed on the second metal layer for isolating the second metal layer and a color filter layer; the color filter layer disposed on the first passivation layer, the color filter layer including, sequentially arranged, a first color resist, a second color resist, and a third color resist; a second passivation layer disposed on the color filter layer for isolating the color filter layer and a pixel electrode layer; and a pixel electrode layer disposed on the second passivation layer; wherein channels are formed at locations where the color resists overlap in the color filter layer, a common electrode line is disposed on the first metal layer corresponding to the channels for achieving light-shielding, and the locations where the color resists overlap are regions where adjacent color resists overlap.

In the above color filter array substrate, the channels are respectively formed at the locations where the color resists overlap in the Y-axis direction.

Preferably, in the above color filter array substrate, the channels are further respectively formed at the locations where the color resists overlap in the X-axis direction, and a metal line is disposed on the second metal layer corresponding to the channels for achieving light-shielding.

Preferably, in the above color filter array substrate, the metal line is an extended portion of the drain.

Preferably, in the above color filter array substrate, the locations where the color resists overlap are locations where a red color resist and a blue color resist overlap, locations where a red color resist and a green color resist overlap, or locations where a blue color resist and a green color resist overlap.

According to yet another embodiment of the present invention, a color filter array substrate comprises a color filter array substrate includes a glass substrate; a first metal layer disposed on the glass substrate, the first metal layer comprising a scanning line and a gate of a thin-film FET; an insulating layer disposed on the first metal layer; an active layer disposed on the insulating layer; an ohmic contact layer disposed on both ends of the active layer; a second metal layer disposed on the ohmic contact layer, the second metal layer comprising a data line, the source and the drain of the thin-film FET; a first passivation layer disposed on the second metal layer for isolating the second metal layer and a color filter layer; the color filter layer disposed on the first passivation layer, the color filter layer including, sequentially arranged, a first color resist, a second color resist, and a third color resist; a second passivation layer disposed on the color filter layer for isolating the color filter layer and a pixel electrode layer; and a pixel electrode layer disposed on the second passivation layer; wherein channels are formed at locations where the color resists overlap in the color filter layer, a metal line is disposed on the second metal layer corresponding to the channels for achieving light-shielding, and the locations where the color resists overlay are regions where adjacent color resists overlap.

Preferably, in the above color filter array substrate, the metal line is an extended portion of the drain.

Preferably, in the above color filter array substrate, the channels are respectively formed at the locations where the color resists overlay in the X-axis direction.

Preferably, in the above color filter array substrate, the width of the metal is greater than or equal to the width of the channels.

Preferably, in the above color filter array substrate, the locations where the color resists overlap are locations where a red color resist and a blue color resist overlap, locations where a red color resist and a green color resist overlap, or locations where a blue color resist and a green color resist overlap.

According to yet another embodiment of the present invention, a liquid crystal display panel is provided comprising the above color filter array substrate.

Compared with the prior art, the present invention changes a stacking structure of color resists to enhance liquidity of the PI and LCD on the basis of without increase of a planarization layer for not increasing costs. That is, channels are formed at locations which color resists overlap in a color filter layer, at this time, and light shielding does not function because there is only one layer of the color resists existing at the channels. In this case, there is a risk of light leakage, so the present invention provides a common electrode line on a first metal layer corresponding to the channels in a Y-axis direction and a metal line on a second metal layer corresponding to the channels in an X-axis direction to prevent the light leakage. The embodiments of the present invention can not only effectively shield the light leakage, but also increase liquidity of the PI and LCD.

To allow the foregoing summary of the present invention to be more clearly understood, there are preferred embodiments, which proceed with reference to the accompanying drawings, and are described in detail as follows.

DESCRIPTION OF SPECIFIC EMBODIMENTS OF THE INVENTION

The terms as used in this specification, "an embodiment" means that the description in connection with the embodiment serves as an example, instance, or illustration of the disclosure. Furthermore, the articles "a" and "an" as used in this specification and the appended claims should generally be construed to mean "one or multiple", unless specified or clear from context to be directed to be a singular form.

According to an embodiment of the present invention, a stacking structure of color resists would be changed to increase liquidity of the PI and LCD on the basis of without an increase of a planarization layer for not increasing costs. That is, channels are formed at locations where color resists overlay in a color filter layer, at this time, and a function of shielding light does not work because there is only one layer of the color resists existing at the channels. In this case, there is a risk of light leakage, so the present invention provides a common electrode line on a first metal layer corresponding to the channels in a Y-axis direction and a metal line on a second metal layer corresponding to the channels in an X-axis direction to prevent the light leakage.

To illustrate the technical solutions of the present invention, the following description is illustrated by specific embodiments.

Figure 1:
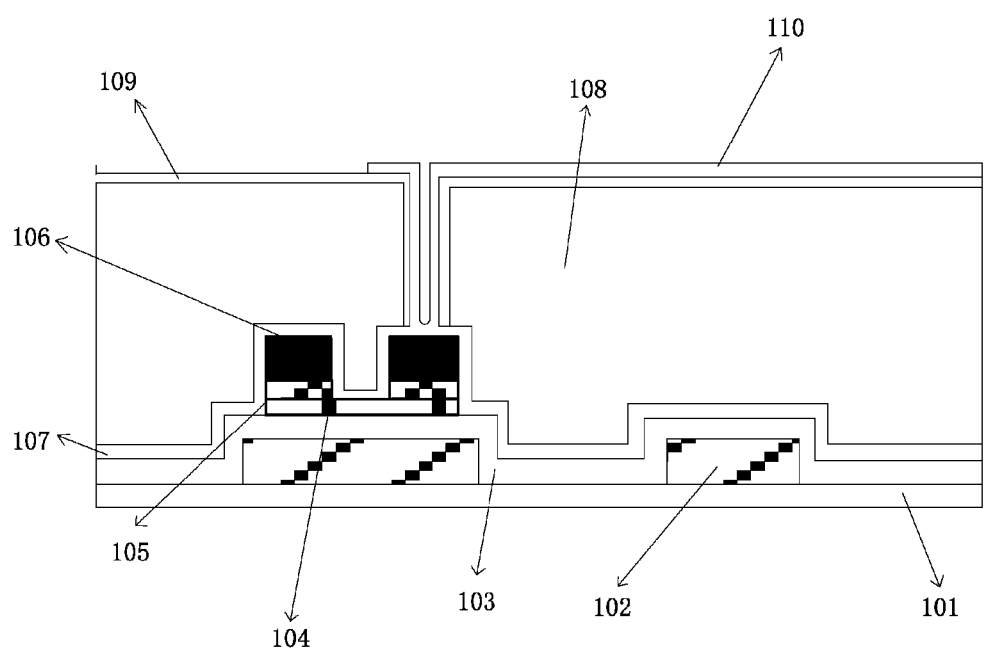
FIG. 1 illustrates a schematic diagram of a structure of a color filter array substrate according to an embodiment of the present invention.

Refer to FIG. 1, which illustrates a schematic diagram of a structure of a color filter array substrate according to an embodiment of the present invention. For ease of illustration, only related parts of the embodiment of the present invention are illustrated.

The color filter array substrate comprises a glass substrate 101, a first metal layer 102, an insulating layer 103, an active layer 104, an ohmic contact layer 105, a second metal layer 106, a first passivation layer 107, a color filter layer 108, a second passivation layer 109, and a pixel electrode layer 110. The first metal layer 102 is disposed on the glass substrate 101, and the first metal layer 102 includes a scanning line, and a gate of a thin-film FET. The insulating layer 103 is disposed on the first metal layer 102. The active layer 104 is disposed on the insulating layer 103 for conducting charges from the source of the thin-film FET to the drain of the thin-film FET when the first metal layer 102 is formed. The ohmic contact layer 105 is disposed on both ends of the active layer 104 for letting a contact resistance between the second metal layer 106 and the active layer 104 be smaller and more easily conducted. The second metal layer 106 is disposed on the ohmic contact layer 105, and the second metal layer 106 includes a data line, the source and the drain of the thin-film FET. The first passivation layer 107 is disposed on the second metal layer 106 for isolating the second metal layer 106 and the color filter layer 108. The color filter layer 108 is disposed on the first passivation layer 107, and the color filter layer 108 includes, sequentially arranged, a first color resist, a second color resist, and a third color resist. The second passivation layer 109 is disposed on the color filter layer 108 for isolating the color filter layer 108 and the pixel electrode layer 110. The pixel electrode layer 110 is disposed on the second passivation layer 109.

Figure 2:
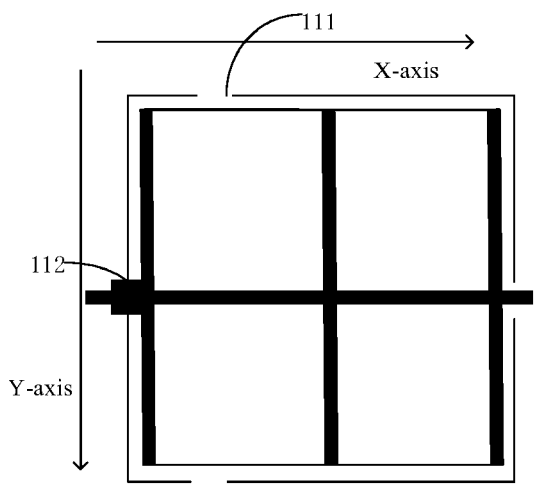
FIG. 2 illustrates a schematic view of shielding the channels by adoption of a common electrode line according to an embodiment of the present invention.

Refer to FIG. 2, which illustrates a schematic view of shielding the channels by adoption of a common electrode line according to an embodiment of the present invention. Channels 111 are formed at locations of color resists overlay in the color filter layer 108. A common electrode line 112 is disposed on the first metal layer 102 corresponding to the channels 111 to achieve light-shielding. The locations where the color resists overlay are regions where adjacent color resists overlap.

In the embodiment of the present invention, the channels 111 are formed at the locations where the color resists overlay in the Y-axis direction. The common electrode line 112 is disposed on the first metal layer 102 corresponding to the channels in the Y-axis direction to achieve light-shielding. That is, a width of the common electrode line corresponding to the channels 111 is widened in a direction of the data line in order to achieve light-shielding. Preferably, the width of the common electrode line corresponding to the channels is greater than or equal to the width of the channels.

In the embodiment of the present invention, the locations where the color resists overlap can be locations where a red color resist and a blue color resist overlap, locations where a red color resist and a green color resist overlap, or locations where a blue color resist and a green color resist overlap. Take an example of a red color resist and a blue color resist which are overlapped, the color resist that is dug to form a channel may be the blue color resist, and also may be the red color resist.

Figure 3:
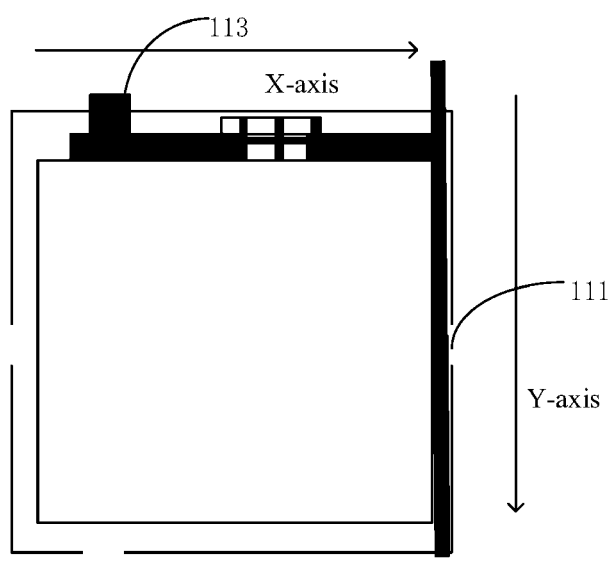
FIG. 3 illustrates a schematic view of shielding the channels by adoption of an additional metal line at the drain of the FET according to another embodiment of the present invention.

Please refer to FIG. 1 in conjunction with FIG. 3, a schematic view of shielding the channels by adoption of an additional metal line at the drain of the FET is illustrated in FIG. 3 according to another embodiment of the present invention.

The color filter array substrate comprises a glass substrate 101, a first metal layer 102, an insulating layer 103, an active layer 104, an ohmic contact layer 105, a second metal layer 106, a first passivation layer 107, a color filter layer 108, a second passivation layer 109, and a pixel electrode layer 110. The first metal layer 102 is disposed on the glass substrate 101, and the first metal layer 102 includes a scanning line, and a gate of a thin-film FET. The insulating layer 103 is disposed on the first metal layer 102. The active layer 104 is disposed on the insulating layer 103 for conducting charges from the source of the thin-film FET to the drain of the thin-film FET when the first metal layer 102 is formed. The ohmic contact layer 105 is disposed on both ends of the active layer 104 for letting a contact resistance between the second metal layer 106 and the active layer 104 be smaller and more easily conducted. The second metal layer 106 is disposed on the ohmic contact layer 105, and the second metal layer 106 includes a data line, the source and the drain of the thin-film FET. The first passivation layer 107 is disposed on the second metal layer 106 for isolating the second metal layer 106 and the color filter layer 108. The color filter layer 108 is disposed on the first passivation layer 107, and the color filter layer 108 includes, sequentially arranged, a first color resist, a second color resist, and a third color resist. The second passivation layer 109 is disposed on the color filter layer 108 for isolating the color filter layer 108 and the pixel electrode layer 110. The pixel electrode layer 110 is disposed on the second passivation layer 109.

In this embodiment of the present invention, channels 111 are formed at locations where color resists overlay in the color filter layer 108. A metal line 113 is disposed on the second metal layer 106 corresponding to the channels in the X-axis direction to achieve light-shielding. The locations where the color resists overlap are regions where adjacent color resists overlap.

In this embodiment of the present invention, the channels 111 are formed at the locations where the color resists overlay in the X-axis direction. The metal line 113 is disposed on the second metal layer 106 corresponding to the channels in the X-axis direction to achieve light-shielding. In the embodiment, the metal line 113 is an extended portion of the drain. That is, in a direction of the scanning line, the extended portion of the drain can shield the channels by extending the drain line to the locations of the channels to achieve light shielding. The width of the metal 113 is greater than or equal to the width of the channels.

In this embodiment of the present invention, the locations where the color resists overlay can be locations where a red color resist and a blue color resist overlap, locations where a red color resist and a green color resist overlap, or locations where a blue color resist and a green color resist overlap. Take an example of a red color resist and a blue color resist which are overlapped, the color resist that is dug to form a channel may be the blue color resist, and also may be the red color resist.

According to another the embodiment of the present invention, there is an LCD panel is further provided. The LCD panel comprises includes a color filter array substrate and a liquid crystal layer. The color filter array substrate comprises a glass substrate 101, a first metal layer 102, an insulating layer 103, an active layer 104, an ohmic contact layer 105, a second metal layer 106, a first passivation layer 107, a color filter layer 108, a second passivation layer 109, and a pixel electrode layer 110. The first metal layer 102 is disposed on the glass substrate 101, and the first metal layer 102 includes a scanning line, and a gate of a thin-film FET. The insulating layer 103 is disposed on the first metal layer 102. The active layer 104 is disposed on the insulating layer 103 for conducting charges from the source of the thin-film FET to the drain of the thin-film FET when the first metal layer 102 is formed. The ohmic contact layer 105 is disposed on both ends of the active layer 104 for letting a contact resistance between the second metal layer 106 and the active layer 104 be smaller and more easily conducted. The second metal layer 106 is disposed on the ohmic contact layer 105, and the second metal layer 106 includes a data line, the source and the drain of the thin-film FET. The first passivation layer 107 is disposed on the second metal layer 106 for isolating the second metal layer 106 and the color filter layer 108. The color filter layer 108 is disposed on the first passivation layer 107, and the color filter layer 108 includes, sequentially arranged, a first color resist, a second color resist, and a third color resist. The second passivation layer 109 is disposed on the color filter layer 108 for isolating the color filter layer 108 and the pixel electrode layer 110. The pixel electrode layer 110 is disposed on the second passivation layer 109.

In this embodiment of the present invention, channels 111 are formed at locations where color resists overlay in the color filter layer 108. Specifically, the channels 111 are respectively formed at the locations where the color resists overlay in the Y-axis direction, and the channels 111 are further respectively formed at the locations where the color resists overlay in the X-axis direction. The locations where the color resists overlay are regions where adjacent color resists overlap.

In this embodiment of the present invention, a common electrode line 112 is disposed on the first metal layer 102 corresponding to the channels in the Y-axis direction to achieve light-shielding. That is, a width of the common electrode line corresponding to the channels 111 is widened in a direction of the data line in order to achieve light-shielding. Preferably, the width of the common electrode line corresponding to the channels is greater than or equal to the width of the channels.

In this embodiment of the present invention, a metal line 113 is disposed on the second metal layer 106 corresponding to the channels in the X-axis direction to achieve light-shielding. In the embodiment, the metal line 113 is an extended portion of the drain. That is, in a direction of the scanning line, the extended portion of the drain can shield the channels by extending the drain line to the locations of the channels to achieve light shielding. The width of the metal 113 is greater than or equal to the width of the channels.

In this embodiment of the present invention, the locations where the color resists overlay can be locations where a red color resist and a blue color resist overlap, locations where a red color resist and a green color resist overlap, or locations where a blue color resist and a green color resist overlap. Take an example of a red color resist and a blue color resist which are overlapped, the color resist that is dug to form a channel may be the blue color resist, and also may be the red color resist.

In short, the present invention changes a stacking structure of color resists to enhance liquidity of the PI and LCD on the basis of without increase of a planarization layer for not increasing costs. Namely, channels is formed at locations where color resists overlay in a color filter layer, and a function of shielding light does not work at this time because only one layer of the color resists is existent at the locations of the channels. In this case, there is a risk of light leakage. Accordingly, the present invention provides a common electrode line on a first metal layer corresponding to the channels in a Y-axis direction and a metal line on a second metal layer corresponding to the channels in an X-axis direction to prevent the light leakage. The embodiments of the present invention not only can effectively shield the light leakage, but also increase liquidity of PI and LCD.

Despite one or more preferred embodiments of the present invention having been illustrated and described, those having ordinary skills in the art may easily contemplate equivalent changes and modifications according to the disclosure and drawings of the present invention. All such modifications and variations are considered to be encompassed in the scope defined by the claims of the present invention. Particularly with regard to the various functions performed by the above-described components, the terms used to describe such components that are intended to perform the specified function, which may be performed by any other components (functionally equivalent unless otherwise indicated), even though other components are not the same in the structure as shown in the exemplary implementations of this specification. Furthermore, although a particular feature relating to a number of embodiments has been disclosed in this specification, this feature may be combined with one or more other features to have other embodiments which are desirable and advantageous to a given or particular application. Moreover, the terms "including", "having", "containing", or variations thereof are used in the detailed description or the claims with a meaning similar to the term "comprising".

In summary, while the present invention has been described with the aforementioned preferred embodiments, it is preferable that the descriptions relating to the above embodiments should be construed as exemplary rather than as limiting of the present invention. One of ordinary skill in the art can make a variety of modifications and variations without departing from the spirit and scope of the present invention as defined by the following claims.

What is claimed is:

1. A color filter array substrate comprising:
    a glass substrate;
    a first metal layer disposed on the glass substrate, the first metal layer comprising a scanning line and a gate of a thin-film FET;
    an insulating layer disposed on the first metal layer;
    an active layer disposed on the insulating layer;
    an ohmic contact layer disposed on both ends of the active layer;
    a second metal layer disposed on the ohmic contact layer, the second metal layer comprising a data line, the source and the drain of the thin-film FET;
    a first passivation layer disposed on the second metal layer for isolating the second metal layer and a color filter layer;
    the color filter layer disposed on the first passivation layer, the color filter layer including, sequentially arranged, a first color resist, a second color resist, and a third color resist;
    a second passivation layer disposed on the color filter layer for isolating the color filter layer and a pixel electrode layer; and
    the pixel electrode layer disposed on the second passivation layer;
    wherein channels are formed at locations where the color resists overlap in the color filter layer, a common electrode line is disposed on the first metal layer corresponding to the channels for achieving light-shielding, and the locations where the color resists overlap are regions where adjacent color resists overlap.

2. The color filter array substrate according to claim 1, wherein the channels are respectively formed at the locations where the color resists overlap in the Y-axis direction.

3. The color filter array substrate according to claim 2, wherein the channels are further respectively formed at the locations where the color resists overlap in the X-axis direction, and a metal line is disposed on the second metal layer corresponding to the channels for achieving light-shielding.

4. The color filter array substrate according to claim 3, wherein the metal line is an extended portion of the drain.

5. The color filter array substrate according to claim 1, wherein the locations where the color resists overlay are locations where a red color resist and a blue color resist overlap, locations where a red color resist and a green color resist overlap, or locations where a blue color resist and a green color resist overlap.

6. A liquid crystal display panel comprising the color filter array substrate according to claim 1.

7. A color filter array substrate comprising:
    a glass substrate;
    a first metal layer disposed on the glass substrate, the first metal layer comprising a scanning line and a gate of a thin-film FET;
    an insulating layer disposed on the first metal layer;
    an active layer disposed on the insulating layer;
    an ohmic contact layer disposed on both ends of the active layer;
    a second metal layer disposed on the ohmic contact layer, the second metal layer comprising a data line, the source and the drain of the thin-film FET;

a first passivation layer disposed on the second metal layer for isolating the second metal layer and a color filter layer;

the color filter layer disposed on the first passivation layer, the color filter layer including, sequentially arranged, a first color resist, a second color resist, and a third color resist;

a second passivation layer disposed on the color filter layer for isolating the color filter layer and a pixel electrode layer; and a pixel electrode layer disposed on the second passivation layer;

wherein channels are formed at locations where color resists overlay in the color filter layer, a metal line is disposed on the second metal layer corresponding to the channels for achieving light-shielding, and the locations where the color resists overlay are regions where adjacent color resists overlap.

8. The color filter array substrate according to claim 7, wherein the metal line is an extended portion of the drain.

9. The color filter array substrate according to claim 7, wherein the channel is respectively formed at the locations where the color resists overlay in the X-axis direction.

10. The color filter array substrate according to claim 7, wherein the width of the metal is greater than or equal to the width of the channel.

11. The color filter array substrate according to claim 7, wherein the locations where the color resists overlay are locations where a red color resist and a blue color resist overlap, locations where a red color resist and a green color resist overlap, or locations where a blue color resist and a green color resist overlap.

* * * * *

UNITED STATES PATENT AND TRADEMARK OFFICE
CERTIFICATE OF CORRECTION

PATENT NO. : 9,568,654 B1  
APPLICATION NO. : 14/904952  
DATED : February 14, 2017  
INVENTOR(S) : Yanxi Ye Page 1 of 1

It is certified that error appears in the above-identified patent and that said Letters Patent is hereby corrected as shown below:

On the Title Page

Item (30) Foreign Application Priority Data

Insert the following:

--Aug. 17, 2015 (CN).............2015 1 0504676.9--

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*